US012618140B2

(12) United States Patent     (10) Patent No.:   US 12,618,140 B2

Strämke     (45) Date of Patent:   May 5, 2026

(54) METHOD FOR SURFACE COATING ACCORDING TO THE SPUTTERING PRINCIPLE

(71) Applicant: ELTRO GmbH, Baesweiler (DE)

(72) Inventor: Marc Strämke, Baesweiler (DE)

(73) Assignee: ELTRO GmbH, Baesweiler (DE)

( * ) Notice: Subject to any disclaimer, the term of this patent is extended or adjusted under 35 U.S.C. 154(b) by 0 days.

(21) Appl. No.: 18/815,233

(22) Filed: Aug. 26, 2024

(65) Prior Publication Data

US 2025/0084526 A1     Mar. 13, 2025

(30) Foreign Application Priority Data

Sep. 11, 2023    (DE) .................... 10 2023 124 377.2

(51) Int. Cl.
   *C23C 14/34*      (2006.01)
   *C23C 14/54*      (2006.01)
   *H01J 37/32*      (2006.01)

(52) U.S. Cl.
   CPC ...... *C23C 14/3407* (2013.01); *C23C 14/3435* (2013.01); *C23C 14/3492* (2013.01); *C23C 14/54* (2013.01); *H01J 37/32449* (2013.01)

(58) Field of Classification Search
   None
   See application file for complete search history.

(56) References Cited

U.S. PATENT DOCUMENTS 5,049,251 A  *   9/1991   Inoue ...................... C23C 14/34
                                    204/192.12
5,110,435 A     5/1992   Haberland 5,611,899 A  *   3/1997   Maass ...................... H01J 37/34
                                  204/298.14
6,458,251 B1  *   10/2002   Sundarrajan .......... C23C 14/046
                                  204/192.15
2015/0060404 A1  *   3/2015   Dhindsa ............ H01J 37/32633
                                  216/61

FOREIGN PATENT DOCUMENTS

| DE | 38 09 734 C1 | 5/1989 |
|---|---|---|
| DE | 10 2013 210 155 A1 | 12/2014 |
| WO | 2004/036616 A1 | 4/2004 |

OTHER PUBLICATIONS

German Search Report dated Apr. 22, 2024 from corresponding German Patent Application No. 10 2023 124 377.2, 4 pages.
European Search Report dated May 12, 2025 from corresponding European Patent Application No. 24192386.1, 8 pages.

* cited by examiner

*Primary Examiner* — Jason Berman
(74) *Attorney, Agent, or Firm* — Ruggiero McAllister & McMahon LLC

(57)          ABSTRACT

There is a method for surface coating using a plasma coating device. The plasma coating device has a vacuum chamber; at least one sputtering source arranged in the vacuum chamber with a target of a solid material; a substrate to be coated; and at least one carrier gas source opening into the vacuum chamber. The method has the following steps: evacuating the vacuum chamber and supplying a carrier gas stream from the carrier gas source to the target such that a plasma with ions from atoms of the carrier gas is produced. The plasma ions dissolve particles out of the solid material of the target, and the dissolved particles are supplied to the surface of the substrate. The carrier gas stream is discontinuously supplied to the target of the sputtering source by modulating the gas flow of the carrier gas stream.

16 Claims, 5 Drawing Sheets

METHOD FOR SURFACE COATING ACCORDING TO THE SPUTTERING PRINCIPLE

CROSS-REFERENCE TO RELATED APPLICATIONS

This application claims priority under 35 U.S.C. § 119 to German patent application DE 10 2023 124 377.2, filed Sep. 11, 2023, the entire disclosure of which is incorporated herein by reference.

BACKGROUND OF THE DISCLOSURE

1. Field of the Disclosure

The disclosure relates to a method for surface coating according to the sputtering principle using a plasma coating device.

2. Description of Related Art

In plasma coating according to the sputtering principle, also referred to as "sputtering", a solid, referred to as a target, is evaporated, which solid can be a metal, for example, thereby producing a plasma to deposit particles of the solid on a substrate, thereby coating the substrate.

SUMMARY OF THE DISCLOSURE

A plasma coating device for surface coating according to the sputtering principle comprises a vacuum chamber which is evacuated by a vacuum pump and in which the substrate to be coated is placed. At least one sputtering source comprising a target made of a solid material is disposed in the vacuum chamber.

In a method referred to as "gas flow sputtering", a carrier gas supplied to the vacuum chamber is used for sputtering. The carrier gas is usually a noble gas, such as argon. For this purpose, the plasma coating device comprises at least one carrier gas source opening into the vacuum chamber, with which a carrier gas stream directed towards the sputtering source is produced. A plasma is produced from atoms of the carrier gas in the area of the target. The ions of the plasma dissolve particles out of the solid material of the target. The dissolved particles are supplied to the surface of the substrate as a preferably directed particle flow, so that the particles are deposited on a surface of the substrate and form a layer thereon.

The coating of surfaces according to the sputtering principles typically requires a low pressure in the coating space, i.e. within the vacuum chamber, to enable collision-free transport of the produced vapor onto the substrate. Higher pressures lead to the formation of larger particles and to a scattering of the vapor in all spatial directions and thus to material loss.

Gas flow sputtering using a carrier gas is described in DE 42 10 125 C2, for example. In addition to cathode sputtering, arc evaporation is used for coating in prior art. In this respect, it is advantageous to generate a current of charged particles which lead to improved layer properties and increased layer adhesion in the coating process.

Furthermore, prior art describes the superimposition of the discharge with a magnetic field in case of a glow discharge to increase the current density ("magnetron sputtering").

To increase the degree of ionization during magnetron sputtering, EP 1 038 045 B1, for example, describes a method referred to as high-power impulse magnetron sputtering (HIPIMS), in which the discharge is electrically modulated with the aim of increasing the current density and thus the degree of ionization. EP 1 038 045 B1 describes the modulated discontinuous supply of a reactive gas to the vacuum pump.

In gas flow sputtering, an increase in the carrier gas flow leads to an increase in the deposition rate. However, high carrier gas velocities require particularly powerful vacuum pumps to maintain the required vacuum pressure inside the vacuum chamber.

Against this background, the object of the present disclosure is to provide an improved method for surface coating according to the principle of gas flow sputtering with high deposition rate.

The method according to the disclosure is defined by the features of claim 1.

Accordingly, the surface coating is carried out with a plasma coating device, comprising:
- a vacuum chamber adapted to be evacuated by a vacuum pump,
- at least one sputtering source arranged in the vacuum chamber with a target made of a solid material,
- a substrate to be coated in the vacuum chamber, and
- at least one carrier gas source opening into the vacuum chamber, which is configured to produce a carrier gas stream directed towards the sputtering source.

According to the method of the disclosure, the vacuum chamber is evacuated and a carrier gas stream is supplied from the carrier gas source to the vacuum chamber to the target such that a plasma with ions from atoms of the carrier gas is produced inside the vacuum chamber in the area of the target ("gas flow sputtering"), wherein the plasma ions dissolve particles out of the solid material of the target and the dissolved particles are supplied to the surface of the substrate as a particle flow, preferably in a directed manner. The dissolved particles are thus deposited on the surface of the substrate where they form a layer.

The peculiarity of the disclosure is that the carrier gas stream is discontinuously supplied to the target of the sputtering source by modulating the gas flow of the carrier gas stream. This means that the carrier gas is supplied with modulated gas flow. Whereas conventionally the carrier gas flow is supplied continuously, i.e. at a continuous gas flow velocity, and the continuous gas flow speed is increased to increase the velocity, according to the disclosure the gas flow of the carrier gas is to be modulated, i.e. vary over time. The carrier gas flow averaged over time, i.e. the average gas flow, is then lower than the carrier gas flow during certain temporal sections of the modulation. Said temporal sections with an increased gas flow of the carrier gas flow compared to the average gas flow are referred to as "peaks". A peak increases the material input onto the substrate to be coated because the gas flow of the carrier gas is increased during a peak.

The disclosure is based on the surprising realization, not expected by a person skilled in the art, that the deposition rate, i.e. the material input onto the substrate, is overall higher with a modulated carrier gas flow than with a continuous carrier gas flow, the gas flow of which corresponds to the average carrier gas flow of the modulated gas stream. The disclosure thus has the decisive advantage that the deposition rate on the substrate can be increased by modulating the carrier gas flow without increasing the average velocity and the average gas flow of the carrier gas stream, respectively. Rather, an increased gas flow is only sufficient during individual, recurring peaks, while the average gas flow can remain unchanged or only slightly increased.

In the present case, the supply of a carrier gas stream to the target from a carrier gas source is distinguished from the supply of a reactive gas from a reactive gas source. The supply of a carrier gas stream is a mandatory component of gas flow sputtering in order to produce a plasma from the carrier gas, which plasma dissolves the particles out of the target. Such a carrier gas is typically a noble gas, such as argon. This is to be distinguished from supplying a reactive gas, which is known from the prior art, so that the reactive gas reacts with the plasma produced from the carrier gas. Modulating a reactive gas stream supplied to the vacuum chamber is not a subject matter of the present disclosure.

The carrier gas stream can be modulated by switching one or more valves in a supply line of the carrier gas source. A supply line of the carrier gas source, which supplies the carrier gas to the carrier gas source, is conceivable with at least two stop valves or proportional valves connected in parallel in order to achieve different flow velocities or varying flow rates of the carrier gas flow by alternately switching the valves.

The carrier gas flow can be modulated by means of amplitude modulation by switching on and off the carrier gas supply, for example. The modulation is performed in recurring phases, wherein the amplitude of the carrier gas flow in at least one of the phases of a modulation period should be significantly increased or reduced by a factor of at least 3 compared to the amplitude in another phase.

For this purpose, the electrical supply of the sputtering source and/or of the substrate can be modulated, particular pulsed, e.g. in the manner known from the HIPIMS method. For example, the electrical supply voltage or the electrical power can be modulated. The modulation of the voltage or power can be carried out asynchronously to the gas flow modulation or, alternatively, particularly preferably synchronized therewith.

The frequency of the modulation should be selected such that the pressure inside the vacuum chamber during a modulation period does not increase by more than approximately 50% and preferably not by more that approximately 20%. Here, "approximately" means a deviation of up to about +/−5%. The modulation frequency should be at least 0.1 Hz, preferably at least 0.5 Hz, so that a modulation period should not last longer than 10 seconds, preferably not longer than 2 seconds.

Inside the vacuum chamber, the pressure should be set such that the pressure in the area of the carrier gas source and in the area of the target is higher than in the area of the substrate in order to promote a particle flow from the carrier gas source and from the target to the substrate. It is advantageous if the pressure inside the vacuum chamber in the area of the target is set so high that the particles dissolved out of the target collide with the carrier gas. For this purpose, the pressure in the area of the target can be set to at least 0.05 mbar or preferably at least 0.2 mbar, for example.

The surface coating can be carried out according to the principle of cathode sputtering, in which each sputtering source and each target, respectively, forms a cathode, the potential of which is lowered compared to that of the plasma produced in the vacuum chamber and compared to that of the vacuum chamber, respectively. The potential of the substrate to be coated can also be lowered so that the substrate also forms a cathode.

Each sputtering source can be configured as a hollow cathode. The carrier gas can preferably be supplied directly to the interior of each hollow cathode. The hollow cathode can be cup-shaped with a bottom and a largely, i.e. over about 90-95% of the circumference, circumferential shell surface. The carrier gas can be supplied through the bottom to the interior of the hollow cathode. The carrier gas source is then formed in the bottom of the hollow cathode. Preferably, the bottom is at anodic potential to prevent an erosion of the bottom. Other elongated, hollow shapes are also conceivable, such as hollow cylindrical, hollow prismatic, hollow cuboid, etc.

The hollow cathode preferably elongated with an opening width that is less than about one third of its depth or length in the direction of gas flow. In the present case, the opening width is understood to be the inner diameter or the minimum distance between opposing inner walls in a cross-section arranged transverse to the longitudinal direction.

According to the disclosure, the phrase "a sputtering source arranged inside the vacuum chamber" means that the sputtering source can be arranged inside the vacuum chamber or inside a housing wall of the vacuum chamber. The sputtering source can be mounted to a wall of the vacuum chamber, be integrated into the wall, and/or protrude from the wall to the interior of the vacuum chamber.

Alternatively, it is also conceivable to perform the method according to the disclosure for surface coating with a magnetron sputtering method, e.g. according to the principle of magnetron sputtering. The principle of direct current (DC) sputtering, triode sputtering, high-frequency (HF) sputtering, atom beam sputtering or ion beam sputtering would also be conceivable.

Advantageously, the disclosure is combined with a pulsed sputtering method in which the electrical energy supply is modulated, preferably pulsed. The modulation can be asynchronous to the gas modulation or preferably synchronized to the gas modulation.

According to the disclosure, it is also conceivable to use several sputtering sources and/or several carrier gas sources, with each sputtering source preferably being assigned its own carrier gas source, so that each target is supplied with carrier gas from a different carrier gas source.

Alternatively or additionally, it is conceivable that a reactive gas opens into the vacuum chamber in order to supply the vacuum chamber with a reactive gas different from the carrier gas, which reacts with the plasma inside the vacuum chamber.

BRIEF DESCRIPTION OF THE DRAWINGS

In the following, exemplary embodiments of the disclosure are explained in more detail with reference to the Figures. In the Figures.

DETAILED DESCRIPTION OF THE DISCLOSURE

The exemplary embodiments according to FIGS. 1-4 each show a plasma coating device 10 comprising a vacuum chamber 12 which can also be referred to as process chamber or treatment chamber. The vacuum chamber 12 is evacuated by a fine vacuum pump 14. A substrate 16 to be coated is disposed in vacuum chamber 12 of each exemplary embodiment. The substrate 16 can be one or several workpieces or other objects to coated, which are introduced into vacuum chamber 12 and removed from vacuum chamber 12 after coating is complete.

Figure 1:
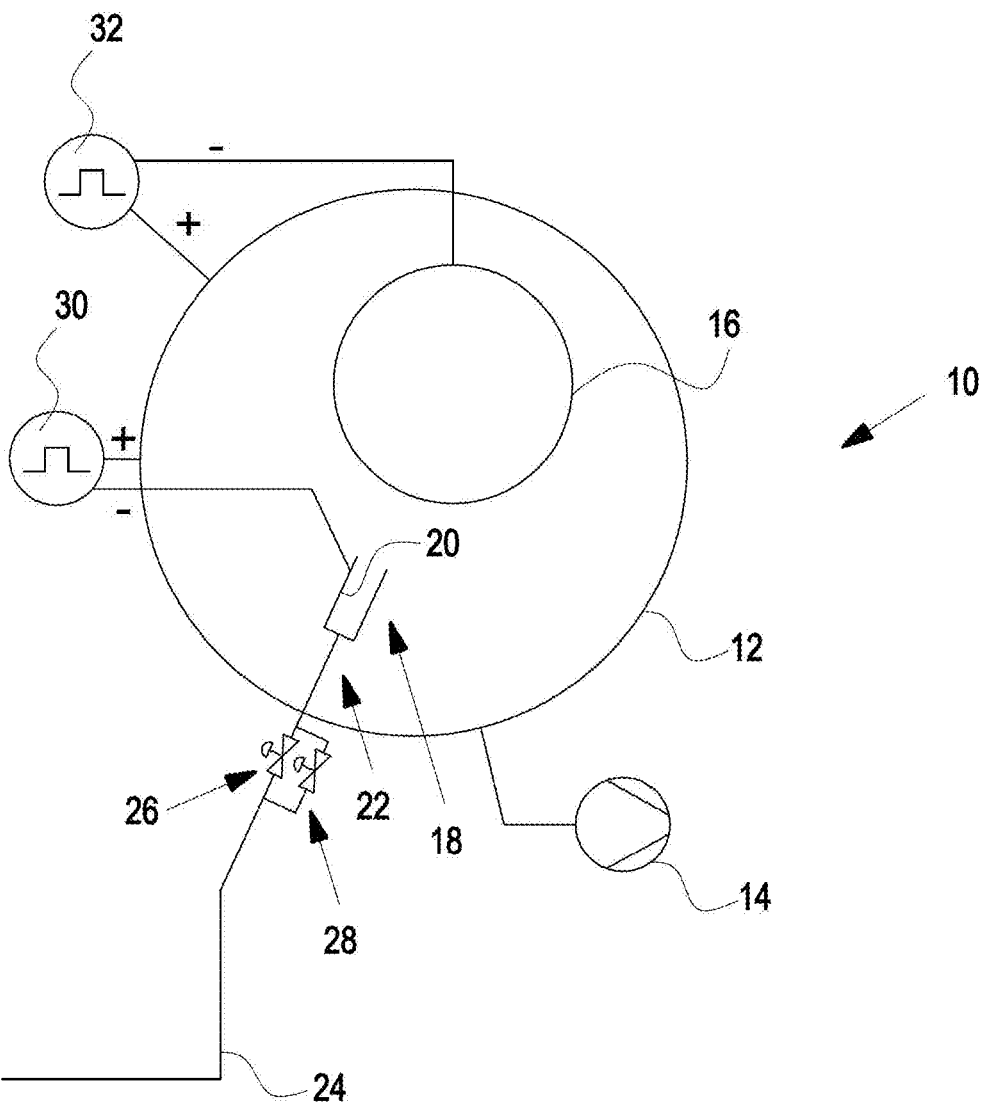
FIG. 1 shows a first exemplary embodiment.
Figure 2:
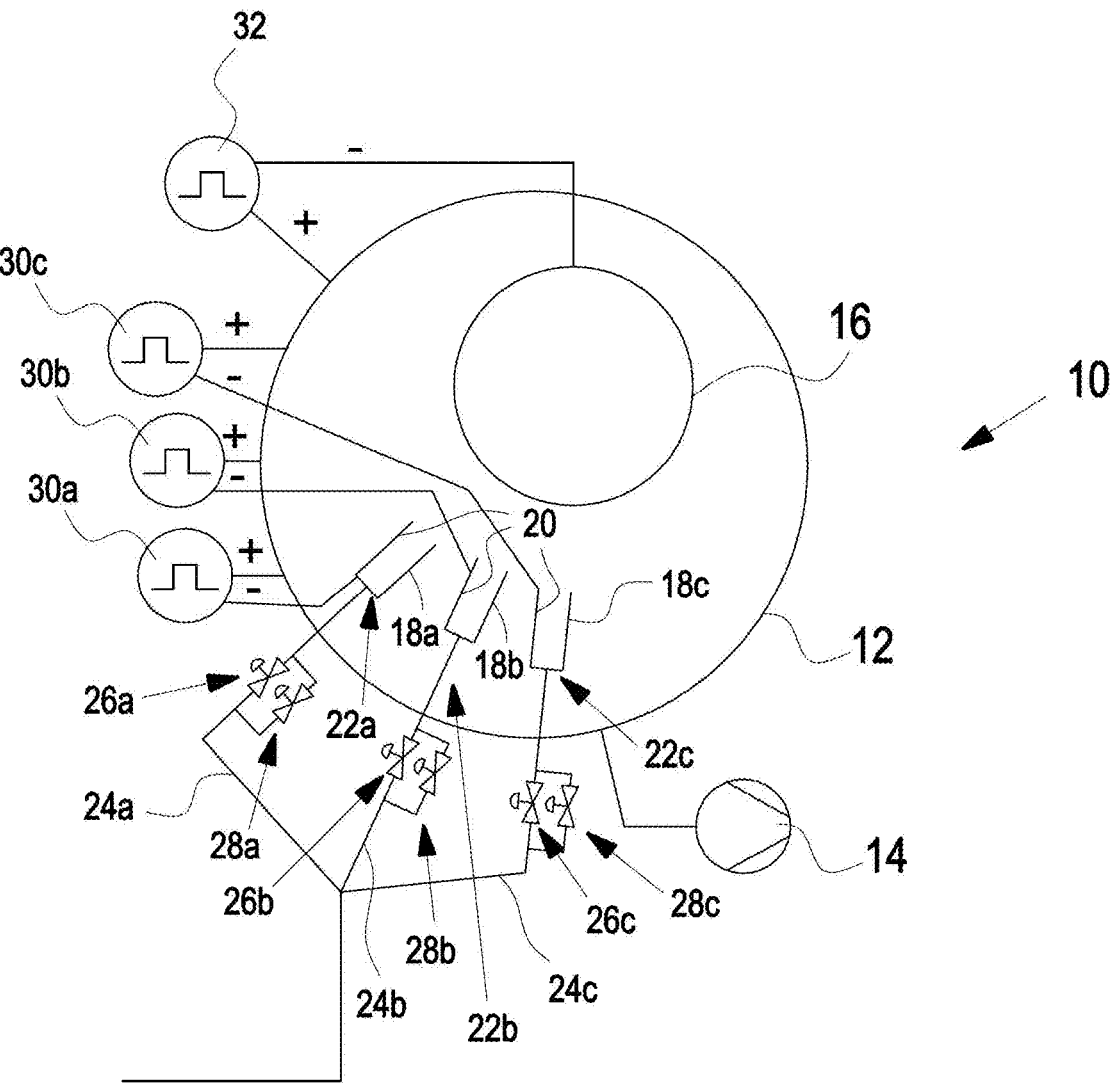
FIG. 2 shows a second exemplary embodiment.
Figure 3:
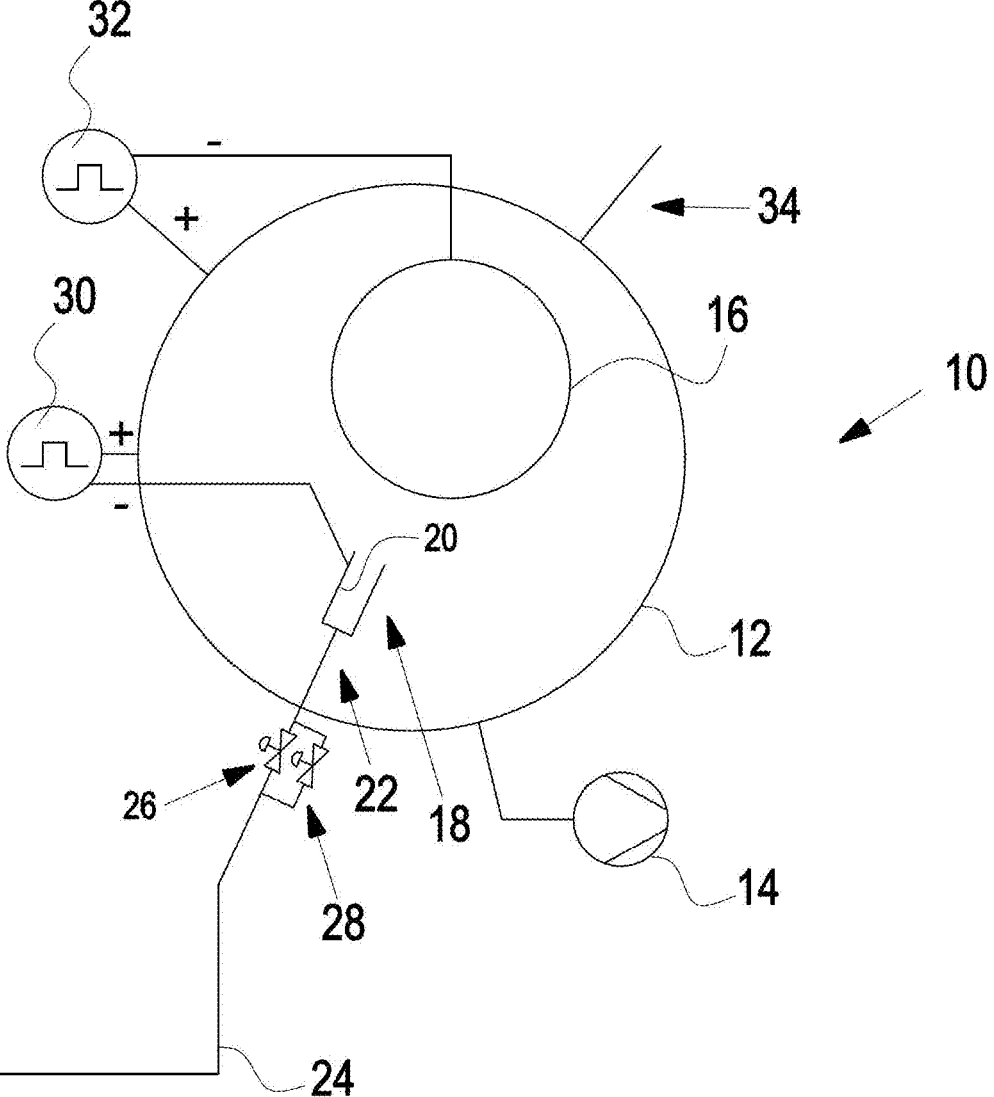
FIG. 3 shows a third exemplary embodiment.
Figure 4:
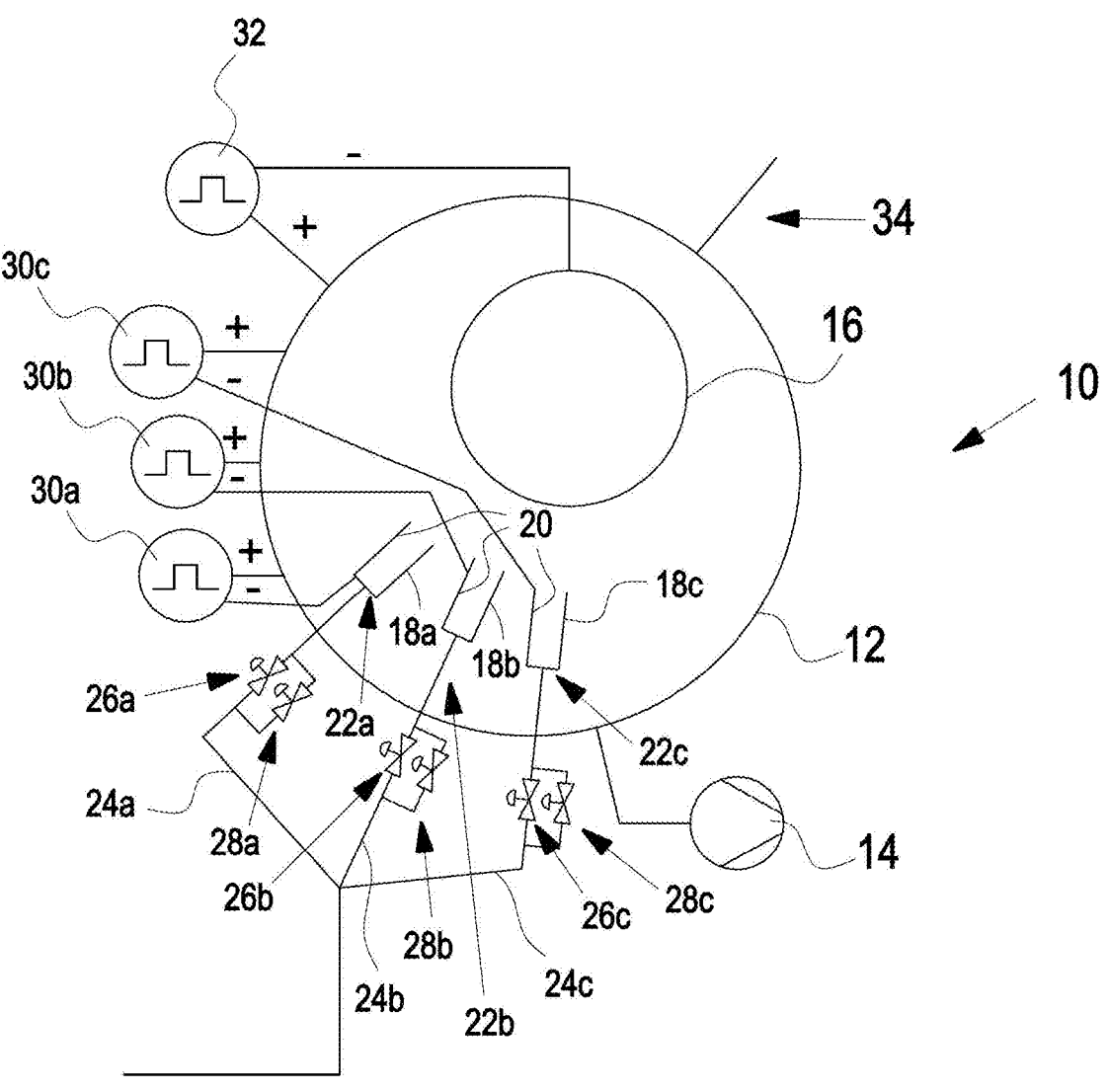
FIG. 4 shows a fourth exemplary embodiment.

In the exemplary embodiments according to FIGS. 1 and 3, exactly one sputtering source 18 is arranged in vacuum chamber 12, whereas in the exemplary embodiments of FIGS. 2 and 4 several, specifically three sputtering sources 18a, 18b, 18c are provided. Each sputtering source 18, 18a, 18b, 18c is configured as a hollow cathode, the circumferential shell surface of which form a target 20. The target 20 is made of a solid material, preferably a metal. A carrier gas source 22, 22a, 22b, 22c assigned to the respective sputtering source opens into the bottom of sputtering source 18, 18a, 18b, 18c and is supplied with carrier gas in the form of a noble gas, such as argon, from a supply line 24.

In the exemplary embodiments according to FIGS. 2 and 4 with respectively three carrier gas sources 22a, 22b, 22c, supply line 24 divides into corresponding supply branches 24a, 24b, 24c, each supply branch 24a, 24b, 24c supplying exactly one corresponding carrier gas source 22a, 22b, 22c. In the exemplary embodiments according to FIGS. 1 and 3, in each supply line 24, and in the exemplary embodiments according to FIGS. 2 and 4, in each supply branch 24a, 24b, 24c, there are two switchable valves 26, 28 and 26a, 28a; 26b, 28b; 26c, 28c, respectively, connected in parallel to one another in order to be able to vary the modulation of the carrier gas supply to the respective carrier gas source 22, 22a, 22b, 22c. The valves can be stop valves or proportional valves. In the illustrated exemplary embodiments, the number of valves per supply line and per supply branch, respectively, is only exemplary. Instead, only one valve per supply line in FIGS. 1 and 3 or per supply branch in FIGS. 2 and 4 is conceivable, e.g. as a proportional valve.

Each sputtering source and each target, respectively, is configured as a cathode and connected to the negative terminal on a corresponding voltage supply source 30 and 30a, 30b, 30c, respectively. The positive terminal of the respective voltage supply source 30, 30a, 30b, 30c is connected to the housing of vacuum chamber 12. In a corresponding manner, the target is also connected to the negative terminal of a further voltage supply source 32, the positive terminal of which is connected to vacuum chamber 12. As a result, substrate 16 also forms a cathode, while the housing or the housing wall of vacuum chamber 12 forms an anode.

The exemplary embodiments of FIGS. 3 and 4 each differ from those in FIGS. 1 and 2 by an additional connection of a reactive gas source 34 to vacuum chamber 12.

Figure 5:
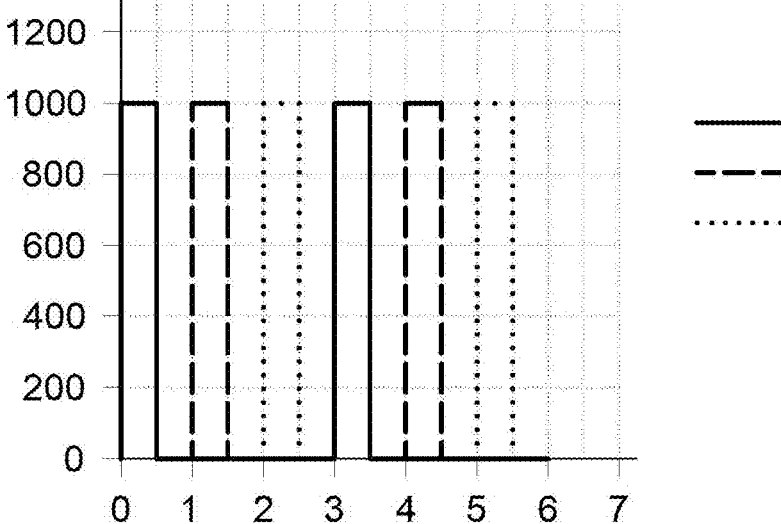
FIG. 5 shows a time diagram of the carrier gas modulation.

The diagram shown in FIG. 5 results for the supply of carrier gas into vacuum chamber 12 or to the respective sputtering source 18 and 18a, 18b, 18c, respectively. The solid line corresponds to the modulated course of the carrier gas flow of carrier gas source 22 in FIGS. 1 and 3 and carrier gas source 22a in FIGS. 2 and 4, respectively. The dashed course corresponds to the resulting course of the modulated carrier gas flow of carrier gas source 22b in FIGS. 2 and 4. In a corresponding manner, the dotted course in FIG. 5 represents the resulting course of the modulated carrier gas flow of carrier gas source 22c in FIGS. 2 and 4. It can be seen from FIG. 5 that alternate switching of the valves 26a, 28a; 26b, 28b; 26c, 28c results in a pulsed course of the supplied carrier gas stream into the vacuum chamber.

What is claimed is:

1. A method for surface coating according to the sputtering principle using a plasma coating device, the plasma coating device comprising:

a vacuum chamber adapted to be evacuated by a vacuum pump, at least one sputtering source arranged in the vacuum chamber with a target made of a solid material, a substrate to be coated in the vacuum chamber, and at least one carrier gas source opening into the vacuum chamber, which is configured to produce a carrier gas stream directed towards the sputtering source, comprising the following steps:

evacuating the vacuum chamber, supplying a carrier gas stream from the carrier gas source to the target such that a plasma with ions from atoms of the carrier gas is produced inside the vacuum chamber in an area of the target, wherein the plasma ions dissolve particles out of the solid material of the target and the dissolved particles are supplied to the surface of the substrate as a particle flow, wherein the carrier gas stream is discontinuously supplied to the target of the sputtering source by modulating the gas flow of the carrier gas stream without increasing an average gas flow of the carrier gas stream over time.

2. The method according to claim 1, wherein the carrier gas flow is modulated by varying an amplitude of the carrier gas flow.

3. The method according to claim 1, wherein the modulation is carried out in recurring phases such that an amplitude of at least one phase of the carrier gas flow is increased or reduced by at least a factor of 3 compared to an amplitude in another phase.

4. The method according to claim 1, wherein the modulation of the carrier gas flow with a modulation frequency is carried out such that a pressure inside the vacuum chamber does not increase by more than 50% during a period of the modulation.

5. The method according to claim 1, wherein the modulation of the carrier gas has a frequency is larger than 0.1 Hz.

6. The method according to claim 1, wherein the carrier gas flow is modulated by actuating at least one valve in a supply line of the carrier gas source.

7. The method according to claim 1, wherein the plasma coating device comprises several sputtering sources, wherein the carrier gas stream supplied to each sputtering source is modulated.

8. The method according to claim 1, wherein each sputtering source has an assigned separate carrier gas source, and wherein the carrier gas stream of each carrier gas source is supplied to the respective sputtering source.

9. The method according to claim 1, wherein the plasma coating device further comprises a reactive gas source opening into the vacuum chamber, from which a reactive gas is supplied to the vacuum chamber, which reactive gas reacts inside the vacuum chamber with a particle stream produced by the carrier gas.

10. The method according to claim 1, wherein the vacuum chamber is evacuated during surface coating to a pressure of less than 0.4 mbar.

11. The method according to claim 1, wherein the method is carried out according to the principle of cathode sputtering, and wherein the target forms a cathode.

12. The method according to claim 1, wherein the vacuum chamber has a housing that forms an anode and the substrate forms another cathode.

13. The method according to claim 1, wherein each sputtering source is configured as a hollow cathode.

14. The method according to claim 1, further comprising an electrical supply of the sputtering source and/or of the substrate that is modulated.

15. The method according to claim 1, wherein the surface coating is carried out by a magnetic sputtering method or according to the principle of ion beam sputtering, atom beam sputtering, high-frequency sputtering or direct current sputtering.

16. The method according to claim 1, wherein the carrier gas stream is supplied during surface coating at a velocity increased in phases without increasing the average velocity of the carrier gas stream.

* * * * *